United States Patent
Bour et al.

(10) Patent No.: US 6,878,959 B2
(45) Date of Patent: Apr. 12, 2005

(54) GROUP III-V SEMICONDUCTOR DEVICES INCLUDING SEMICONDUCTOR MATERIALS MADE BY SPATIALLY-SELECTIVE INTERMIXING OF ATOMS ON THE GROUP V SUBLATTICE

(75) Inventors: David P. Bour, Cupertino, CA (US); Ying-Lan Chang, Cupertino, CA (US); Tetsuya Takeuchi, Sunnyvale, CA (US); Danny E. Mars, Los Altos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/303,044

(22) Filed: Nov. 22, 2002

(65) Prior Publication Data

US 2004/0099856 A1 May 27, 2004

(51) Int. Cl.⁷ .............................................. H01L 29/06
(52) U.S. Cl. .......................... 257/14; 257/11; 257/13; 257/432; 257/744; 438/22
(58) Field of Search ................................ 257/11, 13, 14, 257/103, 106, 87, 94, 98, 432, 744; 438/22, 25–29, 46–48

(56) References Cited

U.S. PATENT DOCUMENTS

| 4,731,789 | A | * | 3/1988 | Thornton ...................... 372/45 |
| 4,771,010 | A | * | 9/1988 | Epler et al. ................... 438/36 |
| 4,824,798 | A | * | 4/1989 | Burnham et al. ........... 438/508 |
| 5,048,038 | A | * | 9/1991 | Brennan et al. .............. 372/46 |
| 6,717,971 | B2 | * | 4/2004 | Marsh et al. ................. 372/50 |

* cited by examiner

*Primary Examiner*—Nathan J. Flynn
*Assistant Examiner*—Scott R Wilson

(57) ABSTRACT

The group III–V semiconductor device comprises a quantum well layer, barrier layers sandwiching the quantum well layer and a region of a third semiconductor material formed by spatially-selective intermixing of atoms on the group V sublattice between the first semiconductor material of the quantum well layer and the second semiconductor material of the barrier layer. The quantum well layer is a layer of a first semiconductor material that has a band gap energy and a refractive index. The barrier layers are layers of a second semiconductor material that has a higher band gap energy and a lower refractive index than the first semiconductor material. The third semiconductor material has a band gap energy and a refractive index intermediate between the band gap energy and the refractive index, respectively, of the first semiconductor material and the second semiconductor material.

26 Claims, 5 Drawing Sheets

GROUP III-V SEMICONDUCTOR DEVICES INCLUDING SEMICONDUCTOR MATERIALS MADE BY SPATIALLY-SELECTIVE INTERMIXING OF ATOMS ON THE GROUP V SUBLATTICE

BACKGROUND OF THE INVENTION

Lasers that operate in a single spatial mode are employed in applications such as those that involve efficient coupling to a single-mode optical fiber and those in which a diffraction-limited beam is needed, e.g., in optical data storage, laser printing, etc. Semiconductor lasers capable of operating in a single spatial mode include buried heterostructure waveguide lasers.

A buried heterostructure waveguide laser includes a buried heterostructure waveguide made by fabricating a layer structure composed of layers of materials having different refractive indices sequentially deposited on a substrate. The buried heterostructure waveguide is characterized by a very large refractive index step ($\Delta n \sim 0.1$) between an active stripe and cladding layers located immediately next to the active stripe in the layer structure. The width of the heterostructure waveguide in the direction parallel to the major surface of the layer structure is typically made very small ($\sim 1$ $\mu$m) to minimize the threshold current ($I_{th} < 10$ mA) of the laser. The buried heterostructure waveguide laser typically includes a pair of lateral confinement structures that define the width of the buried heterostructure waveguide.

A buried heterostructure waveguide laser can be easily fabricated of aluminum-free materials, such as indium gallium arsenide phosphide (InGaAsP), because lateral confinement structures can be formed by multiple regrowths in such materials without introducing interface states at the regrowth surfaces. However, when the active region of the laser is fabricated of materials that contain aluminum, such as aluminum gallium arsenide (AlGaAs), a simple regrowth process cannot be used. Accordingly, lasers whose active layer includes materials containing aluminum are typically configured as ridge waveguide lasers or include a laterally-oxidized structure to define the width of the waveguide.

Layer disordering is another option for defining the width of the waveguide of a buried heterostructure waveguide laser in which one or more of the materials of the active layer includes aluminum. The lateral confinement structures are composed of a semiconductor material formed by the layer disordering. Typically, a donor impurity, typically silicon (Si), is selectively diffused into the regions where the lateral confinement structures are to be located. The n-type impurity increases the concentration of vacancies in the group III lattice, which promotes intermixing of the group III elements. The intermixing occurs by the aluminum (Al) and gallium (Ga) atoms moving on the group III sublattice via the vacancies created by the donor impurity. The aluminum that diffuses from layers in which the aluminum fraction is higher into layers in which the aluminum fraction is lower tends to homogenize the aluminum fraction in the regions of the layers located in the lateral confinement structures.

The increased aluminum fraction in the lateral confinement structures increases the bandgap energy of the material of lateral confinement structures, and, as a result of the Kramers-Kronig relationship between band gap energy and refractive index, decreases the refractive index of this material. The semiconductor material formed by intermixing on the group III sublattice promoted by the diffusion of a donor impurity such as silicon provides a strong ($\Delta n \geq 0.1$) lateral optical confinement structure in the layer structure.

Intermixing of atoms on the group III sublattice is an effective technique for producing strong lateral confinement structures in AlGaAs-based index-guided lasers. Buried heterostructure waveguides using lateral confinement structures fabricated by intermixing of atoms on the group III sublattice have been used to make very high power single-mode lasers that operate in the wavelength range from 780 to 980 nm.

The optical fibers used in optical communication systems have their lowest losses in the wavelength range from about 1.2 $\mu$m to about 1.65 $\mu$m. The International Telecommunications Union has established an optical frequency standard grid covering the wavelength range from about 1.492 $\mu$m to about 1.612 $\mu$m. Optical communication systems operating in this wavelength range use lasers to generate the optical signals. Recently, quantum well heterostructures in which the semiconductor material of the quantum well layers is gallium arsenide nitride or indium gallium arsenide nitride ((In)GaAsN) or gallium arsenide antimonide (GaAsSb) and the semiconductor material of the barrier layers is aluminum gallium arsenide or gallium arsenide ((Al)GaAs) have been proposed for use in buried heterostructure waveguide lasers that generate light at wavelengths longer than 1.25 $\mu$m.

What is needed is a lateral confinement structure for use in long-wavelength buried heterostructure waveguide lasers having a quantum well heterostructure in which the semiconductor material of the quantum well layers is (In)GaAsN or GaAsSb and the semiconductor material of the barrier layers is (Al)GaAs.

SUMMARY OF THE INVENTION

The invention provides a group III–V semiconductor device that comprises a quantum well layer, barrier layers sandwiching the quantum well layer and a region of a third semiconductor material formed by spatially-selective intermixing of atoms on the group V sublattice between the first semiconductor material of the quantum well layer and the second semiconductor material of the barrier layer. The quantum well layer is a layer of a first semiconductor material that has a band gap energy and a refractive index. The barrier layers are layers of a second semiconductor material that has a higher band gap energy and a lower refractive index than the first semiconductor material. The third semiconductor material has a band gap energy and a refractive index intermediate between the band gap energy and the refractive index, respectively, of the first semiconductor material and the second semiconductor material.

The invention also provides a method of making a semiconductor device, In the method, a first layer of a first semiconductor material having a band gap energy and a refractive index is formed between adjacent second layers of a second semiconductor material having a higher band gap energy and a lower refractive index than the first semiconductor material. Spatially-selective intermixing of atoms on the group V sublattice is promoted between the first semiconductor material of the first layer and the second semiconductor material of the second layers to form a region of a third semiconductor material. The third semiconductor material has a band gap energy and a refractive index intermediate between the band gap energy and the refractive index, respectively, of the first semiconductor material and the second semiconductor material.

The third semiconductor material has a band gap energy and refractive index intermediate between those of the first and second semiconductor materials. These properties enable the region of the third semiconductor material to be used as a lateral confinement structure of a buried heterostructure waveguide laser and the control region of an electroabsorption modulator.

BRIEF DESCRIPTION OF THE DRAWINGS

The invention can be better understood with reference to the following drawings. The components in the drawings are not necessarily to scale: emphasis is instead placed upon clearly illustrating the invention. Moreover, in the drawings, like reference numerals designate corresponding parts throughout the several views.

DETAILED DESCRIPTION OF THE INVENTION

The invention provides a group III–V semiconductor device that comprises a quantum well layer and barrier layers sandwiching the quantum well layer. The semiconductor device additionally comprises a region of a semiconductor material formed by spatially-selective intermixing of atoms on the group V sublattice between the semiconductor materials of the quantum well layer and barrier layers. The semiconductor material of the region has a band gap energy and a refractive index intermediate between the band gap energy and the refractive index, respectively, of the semiconductor materials of the quantum well layer and the barrier layers. Exemplary applications of the group III–V semiconductor device to be described below take advantage of the difference in band gap energy and refractive index between the semiconductor materials of the quantum well layer and the region.

Figure 1:
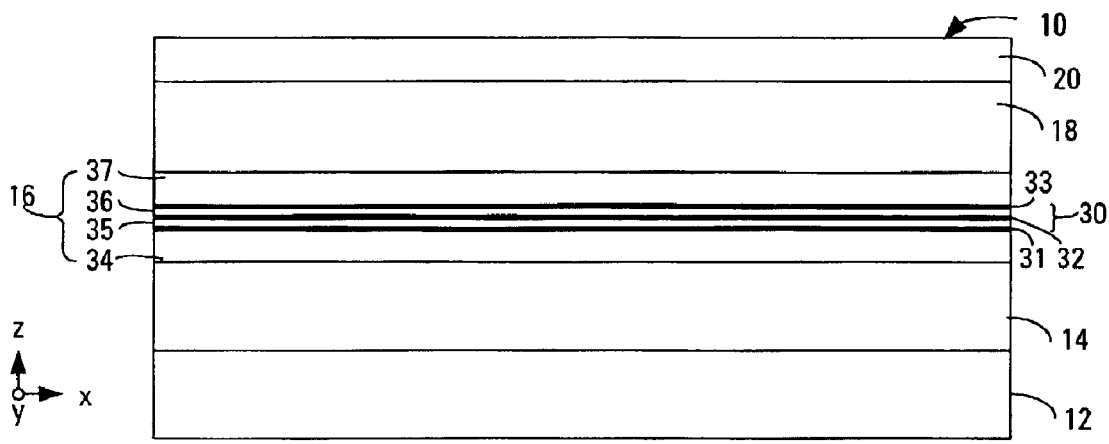
FIG. 1 is an end view of an exemplary semiconductor layer structure in which semiconductor devices according to the invention can be fabricated.

FIG. 1 shows a layer structure 10 in which many group III–V semiconductor devices according to the invention can be fabricated. Layer structure 10 is composed of a GaAs wafer 12 over which are located, in order, an n-type aluminum gallium arsenide (AlGaAs) cladding layer 14, an active layer 16, a p-type AlGaAs cladding layer 18 and a cap layer 20 of p-type gallium arsenide (GaAs). Active layer 16 includes quantum well (QW) heterostructure 30.

Quantum well heterostructure 30 is composed of quantum well layers 31, 32 and 33 of indium gallium arsenide nitride (InGaAsN) interleaved with barrier layers 34, 35, 36 and 37 of GaAs. Barrier layers 34 and 37 differ in thickness from barrier layers 35 and 36 and constitute the majority of the thickness of the active layer. Barrier layers 34–37 alternatively may all be equal in thickness. In this case, the quantum well heterostructure is sandwiched between two waveguide layers of a semiconductor material having a substantially higher refractive index than cladding layers 14 and 18. The combination of quantum well materials just described enables a buried heterostructure waveguide laser fabricated in layer structure 10 to generate light at a wavelength of 1.3 $\mu$m or more for use in optical communication via optical fibers and in other applications.

In alternative embodiments of layer structure 10, the material of quantum well layers 31–33 is gallium arsenide nitride (GaAsN) or gallium arsenide antimonide (GaAsSb) and the material of barrier layers 34–37 is indium gallium arsenide (InGaAs), GaAs or InGaAsN. Also, FIG. 1 shows an example in which quantum well heterostructure 30 is a multiple quantum well heterostructure composed of three quantum well layers and four barrier layers. The number of quantum well layers and barrier layers may differ from that shown: the quantum well heterostructure may be composed of as few as one quantum well layer. The quantum well layers are interleaved with the barrier layers. Consequently, the number of barrier layers is one greater than the number of quantum well layers.

Figure 2A:
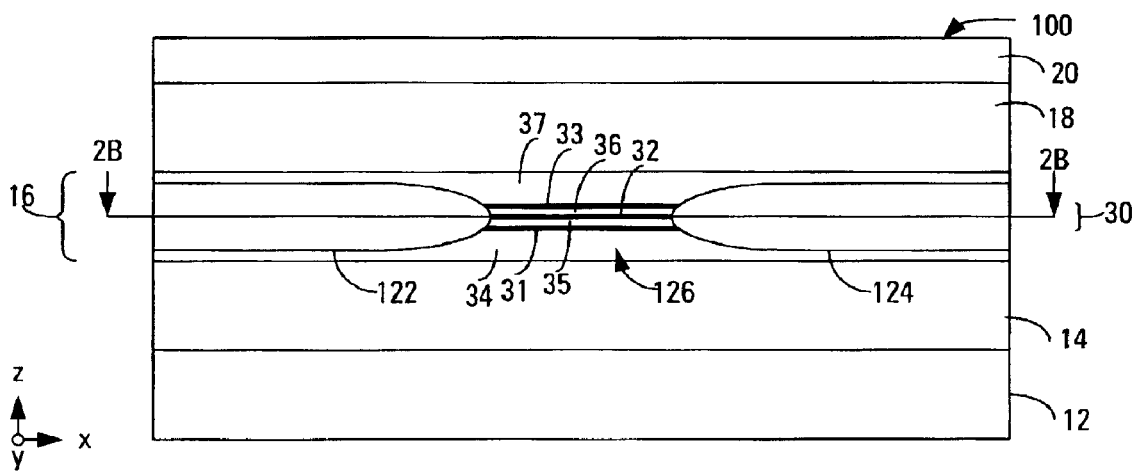
FIG. 2A is an end view of an embodiment of a buried heterostructure waveguide laser as a first example of a semiconductor device according to the invention.
Figure 2B:
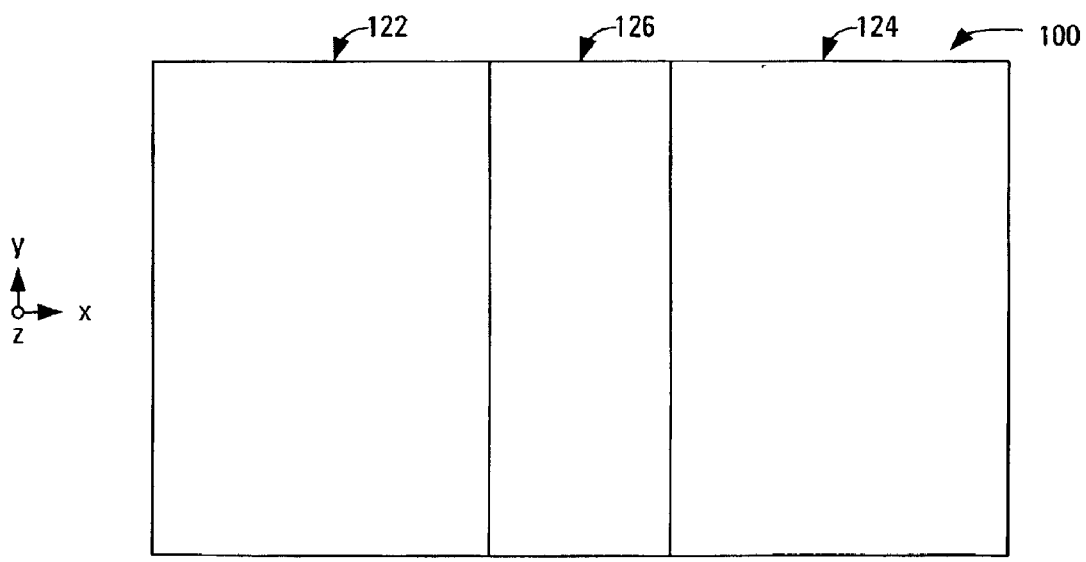
FIG. 2B is a cross-sectional view of the embodiment of the buried heterostructure waveguide laser shown in FIG. 2A along the line 2B—2B.

FIGS. 2A and 2B show buried heterostructure waveguide laser 100 as an example of group III–V semiconductor device according to the invention. Buried heterostructure waveguide laser 100 includes two regions of a semiconductor material that constitute lateral confinement structures 122 and 124. The lateral confinement structures define the lateral extent of waveguide 126 in the active layer.

Buried heterostructure waveguide laser 100 is one of many buried heterostructure waveguide lasers fabricated in layer structure 10 shown in FIG. 1 by forming the lateral confinement structures 122 and 124 by promoting spatially-selective intermixing of atoms on the group V sublattice in regions of quantum well heterostructure 30. The lateral confinement structures form in the regions in which the intermixing is promoted. The spatially-selective intermixing occurs between regions of quantum well layers 31–33 and corresponding regions of the barrier layers 34–37. The intermixing is spatially selective in the sense that it occurs only in a defined region of the quantum well heterostructure and throughout the entire quantum well heterostructure. After the lateral confinement structures have been formed by the spatially-selective intermixing, the quantum well layers and barrier layers exist only in waveguide 126.

The intermixing causes the semiconductor material of lateral confinement structures 122 and 124 to have a higher bandgap energy and a lower refractive index than the bandgap energy and refractive index, respectively, of the material of the quantum well layers, and a lower bandgap energy and a higher refractive index than the bandgap energy and refractive index, respectively, of the semiconductor material of the barrier layers.

Lateral confinement structures 122 and 124 collectively define the lateral extent of waveguide 126 in the x-direction shown in FIG. 2A. Specifically, the lateral extent of the waveguide is defined by the large refractive index difference between the semiconductor material of quantum well layers 31–33 and the semiconductor material of the lateral confinement structures. The extent of waveguide 126 in the z-direction is defined by the large refractive index difference at the boundaries between barrier layers 34 and 37 and cladding layers 14 and 18, respectively. Light generated by recombination of carriers in the regions of quantum well layers 31–33 located in waveguide 126 is confined within the waveguide by the refractive index contrasts in both the x- and z-directions. The band-gap energy difference between the quantum well layers and the lateral confinement structures additionally laterally confines carriers to the quantum well layers.

As noted above, lateral confinement structures 122 and 124 are formed by promoting intermixing of atoms on the group V lattice between the semiconductor materials of the quantum well heterostructure 30 in the regions where the lateral confinement structures are to be located. The intermixing forms the lateral confinement structure of a semiconductor material having the above-described differences in bandgap energy and refractive index relative to those of the materials of the regions of the quantum well heterostructure located in waveguide 126.

Also as noted above, semiconductor materials for quantum well layers 31–33 in a long-wavelength buried heterostructure waveguide laser that generates light at wavelengths greater than 1.3 μm include (In)GaAsN and GaAsSb. (In)GaAsN is indium gallium arsenide nitride in which the indium fraction is greater than or equal to zero. The group V elements of these materials are arsenic (As) and either nitrogen (N) or antimony (Sb). The optical and electrical properties of semiconductor materials that include either of these elements depend on the fraction of the element in the material.

In (In)GaAsN, the bandgap energy decreases and the refractive index increases as the fraction of nitrogen increases. Although the nitrogen fraction in the (In) GaAsN used in the quantum well layers of long-wavelength lasers is small, typically less than 5%, nitrogen has a large bowing parameter in (In)GaAs. Consequently, the bandgap energy of (In)GaAsN depends strongly upon the nitrogen fraction. In lateral confinement structures 122 and 124, the spatially-selective intermixing of atoms on the group V sublattice occurs between the semiconductor material of quantum well layers 31–33 and the semiconductor material of adjacent ones of barrier layers 34–37. The semiconductor material of the barrier layers initially has lower nitrogen fraction (e.g., 0) than the semiconductor material of the quantum well layers. The intermixing forms the semiconductor material of the lateral confinement structures with a lower nitrogen fraction than that of the semiconductor material of the quantum well layers and a higher nitrogen fraction than that of the barrier layers. Accordingly the semiconductor material of the lateral confinement structures differs substantially in bandgap energy and refractive index from the semiconductor material of the quantum well layers and the semiconductor material of the barrier layers.

In an embodiment in which the semiconductor material of quantum well layers 31–33 is GaAsSb, the antimony fraction is about 30–60%, which is substantially higher than the nitrogen fractions described above. In such an embodiment, increasing the fraction of antimony decreases the bandgap energy and increases the refractive index of the material. In lateral confinement structures 122 and 124, intermixing of atoms on the group V sublattice occurs between the semiconductor material of quantum well layers 31–33 and the semiconductor material of adjacent ones of barrier layers 34–37. The semiconductor material of the barrier layers initially has lower antimony fraction (e.g., 0) than the semiconductor material of the quantum well layers. The intermixing forms the material of the lateral confinement structures with a lower antimony fraction than that of the semiconductor material of the quantum well layers and a higher antimony fraction than that of the semiconductor material of the barrier layers. Accordingly the material of the lateral confinement structures differs substantially in bandgap energy and refractive index from the semiconductor material of the quantum well layers and the semiconductor material of the barrier layers.

Figure 3A:
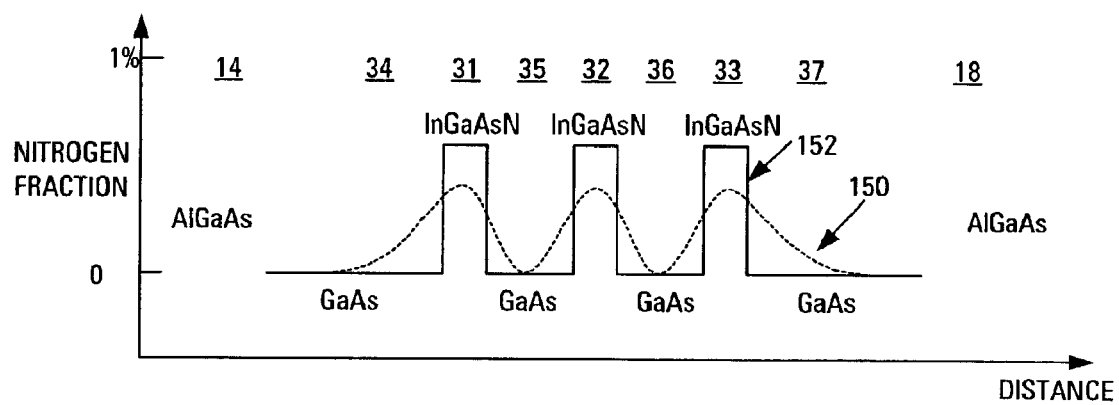
FIG. 3A is a graph that schematically compares the variation of the nitrogen fraction with distance from the substrate in the lateral confinement structure of the buried heterostructure waveguide laser shown in FIGS. 2A and 2B and in a corresponding region of the layer structure shown in FIG. 1 before intermixing was promoted.

FIG. 3A schematically compares the variation of the nitrogen fraction with distance from the substrate in the semiconductor materials of buried heterostructure waveguide laser 100 (curve 150, broken line) and in the materials of a corresponding region of layer structure 10 before the spatially-selective intermixing of atoms on the group V sublattice was promoted to form lateral confinement structure 122 (curve 152, solid line). The layers of the layer structure and of the buried heterostructure waveguide laser are indicated by the same reference numerals as those used in FIGS. 1 and 2A. Before the intermixing of atoms on the group V sublattice was promoted, the nitrogen fraction differs sharply between the semiconductor materials of quantum well layers 31–33 and barrier layers 34–37 since only the semiconductor material of the quantum well layers contains nitrogen. The intermixing causes a net diffusion of nitrogen from the quantum well layers into the adjacent barrier layers. As a result, in the semiconductor material of lateral confinement structure 122 of buried heterostructure waveguide laser 100, the nitrogen fraction is intermediate between that of the semiconductor materials of the quantum well layers and of the barrier layers of layer structure 10. Moreover, since the spatially-selective intermixing of atoms on the group V sublattice leaves the nitrogen fractions in the materials of the quantum well layers and the barrier layers in waveguide 126 of buried heterostructure waveguide laser 100 unchanged relative to corresponding layers of layer structure 10, the nitrogen fraction in the semiconductor material of the lateral confinement structure is less than that in the semiconductor material of the quantum well layers and greater than that in the semiconductor material of the barrier layers in the waveguide.

Figure 3B:
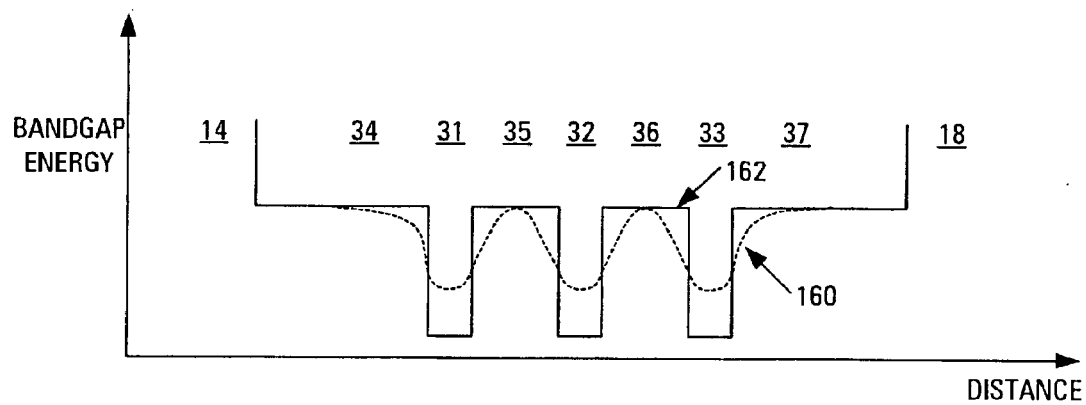
FIG. 3B is a graph that schematically compares the variation of the bandgap energy with distance from the substrate in the lateral confinement structure of the buried heterostructure waveguide laser shown in FIGS. 2A and 2B and in a corresponding region of the layer structure shown in FIG. 1 before intermixing was promoted.

FIG. 3B schematically compares the variation in the bandgap energy with distance from the substrate in the semiconductor materials of buried heterostructure waveguide laser 100 (curve 160, broken line) and in the semiconductor materials of a corresponding region of layer structure 10 before intermixing of atoms on the group V sublattice was promoted to form lateral confinement structure 122 (curve 162, solid line). Because of the large bowing parameter of nitrogen in (In)GaAs, a small amount of intermixing of atoms on the group V sublattice produces the semiconductor material of the lateral confinement structure with a large difference in bandgap energy relative to the materials of the quantum well layers and barrier layers. This creates the refractive index and bandgap energy differences between the semiconductor materials of waveguide 126 and lateral confinement structures 122 and 124 that are needed to provide effective optical waveguiding and carrier confinement. Lateral confinement structures 122 and 124 enable buried heterostructure waveguide laser 100 having quantum well layers of InGaAsN to generate light at wavelengths of greater than 1.3 µm with high efficiency and a low threshold current.

Returning briefly to FIG. 1, in an exemplary embodiment of layer structure 10, wafer 12 is a wafer of (100) n-type GaAs with a buffer layer (not shown) of n-type GaAs located on its major surface. Cladding layer 14 was a 1.5 µm-thick layer of n-type $Al_{0.3}Ga_{0.7}As$ doped with silicon at $1\times10^{18}$ $cm^{-3}$. Barrier layers 34 and 37 were each a 120 nm-thick layer of GaAs. Quantum well layers 31–33 were each a 7 nm-thick layer of $In_{0.35}Ga_{0.65}As_{0.99}N_{0.01}$. Barrier layers 35 and 36 were each a 17 nm-thick layer of GaAs. Cladding layer 18 was a 1.5 µm-thick layer of p-type $Al_{0.3}Ga_{0.7}As$ doped with carbon at $1\times10^{18}$ $cm^{-3}$. Cap layer was a 100 nm-thick layer of p-type GaAs doped with carbon.

Layer structure 10 is fabricated by epitaxially growing the layers just described on a wafer of n-type GaAs using a suitable epitaxial growth process such as metal-organic chemical vapor deposition (MOCVD) or molecular beam epitaxy (MBE). No dopant is added to the layers constituting active layer 16 during growth.

Figure 4:
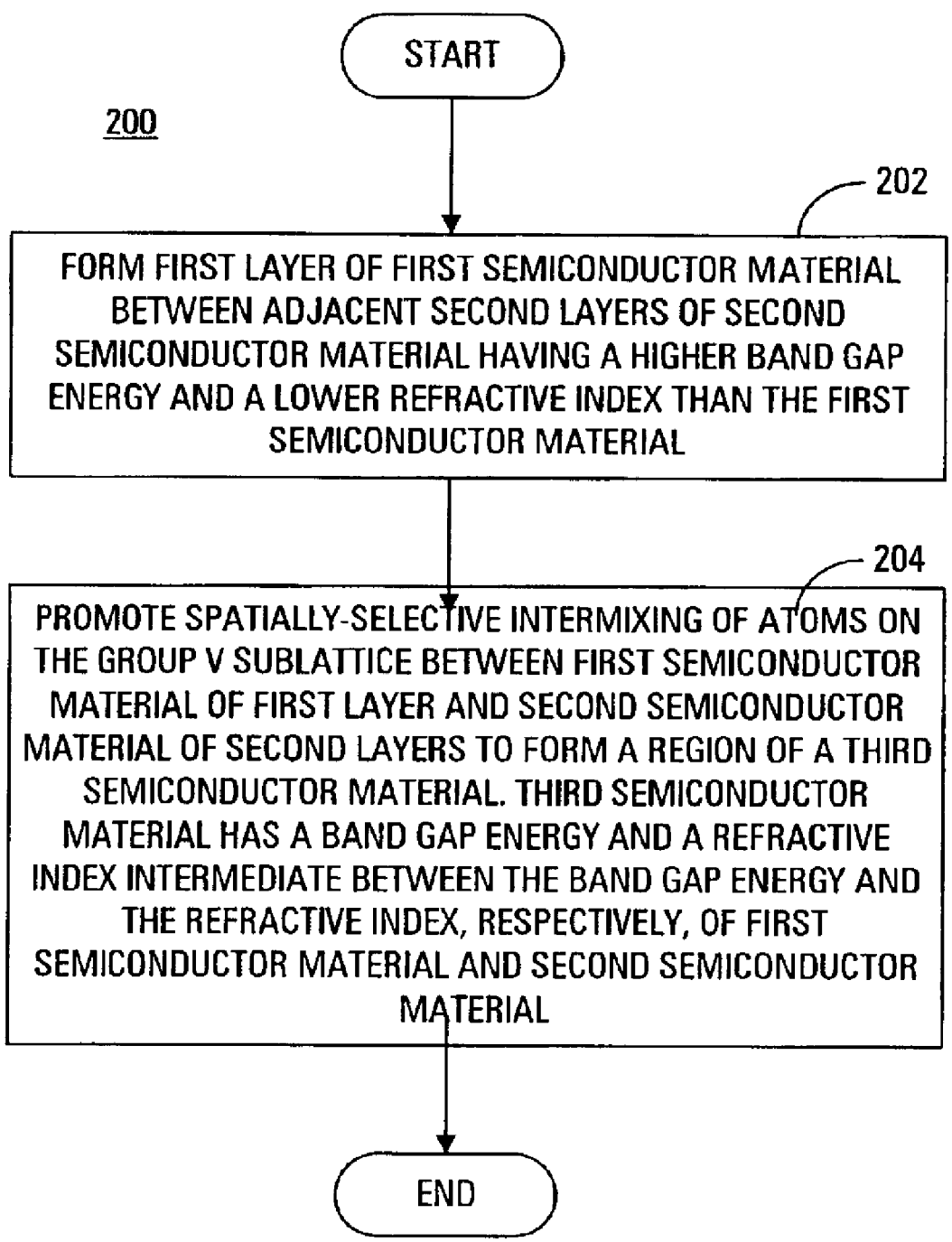
FIG. 4 is flow chart of an embodiment of a method according to the invention for making a semiconductor device.

FIG. 4 is a flow chart that illustrates an embodiment 200 of a method according to the invention for making a group III–V semiconductor device. In the method, in block 202, a first layer of a first semiconductor material having a band gap energy and a refractive index is formed between adjacent second layers of a second semiconductor material having a higher band gap energy and a lower refractive index than the first semiconductor material. Then, in block 204, spatially-selective intermixing of atoms on the group V sublattice is promoted between the first semiconductor material of the first layer and the second semiconductor material of the second layers to form a region of a third semiconductor material. The third semiconductor material has a band gap energy and a refractive index intermediate between the band gap energy and the refractive index, respectively, of the first semiconductor material and the second semiconductor material.

For example, in fabricating layer structure 10; quantum well layer 32 of InGaAsN is formed between adjacent barrier layers 35 and 36 of GaAs. The band gap energy and refractive index of InGaAsN differ from those of GaAs. Then, spatially-selective intermixing of atoms on the group V sublattice is promoted between the InGaAsN of the quantum well layer and the GaAs of the second layers to form lateral confinement structures 122 and 124 of a third semiconductor material. The third semiconductor material is GaAsN in which the nitrogen fraction is less than that in the InGaAsN of the quantum well layer and greater than that in the GaAs of the barrier layers. Consequently, the semiconductor material of the lateral confinement structures has a band gap energy and a refractive index intermediate between the band gap energy and the refractive index, respectively, of the InGaAsN of the quantum well layer and the GaAs of the barrier layers.

A number of different techniques are available for use in block 154 to promote spatially-selective intermixing of atoms on the group V sublattice to form lateral confinement structures 122 and 124. Two basic intermixing promotion mechanisms are involved. In the first intermixing promotion mechanism, atoms of an acceptor (p-type) impurity are introduced into regions of the quantum well heterostructure where the lateral confinement structures are to be formed. The p-type doping creates a high concentration of vacancies on the group-V sublattice that enable the intermixing on the group V sublattice to take place. The second intermixing promotion mechanism involves the creation of vacancies in the group V sublattice that can be occupied by other group V atoms.

In an example of the first intermixing promotion technique, an acceptor impurity such as zinc or magnesium is selectively diffused into regions of layer structure 10 in which it is desired to locate lateral confinement structures 122 and 124. In the regions of quantum well heterostructure 30 into which the acceptor impurity diffuses, the p-type doping creates a high concentration of vacancies on the group V sublattice that enable intermixing on the group V sublattice between the materials of the quantum well layers and the barrier layers to form the lateral confinement structures.

Figure 5A:
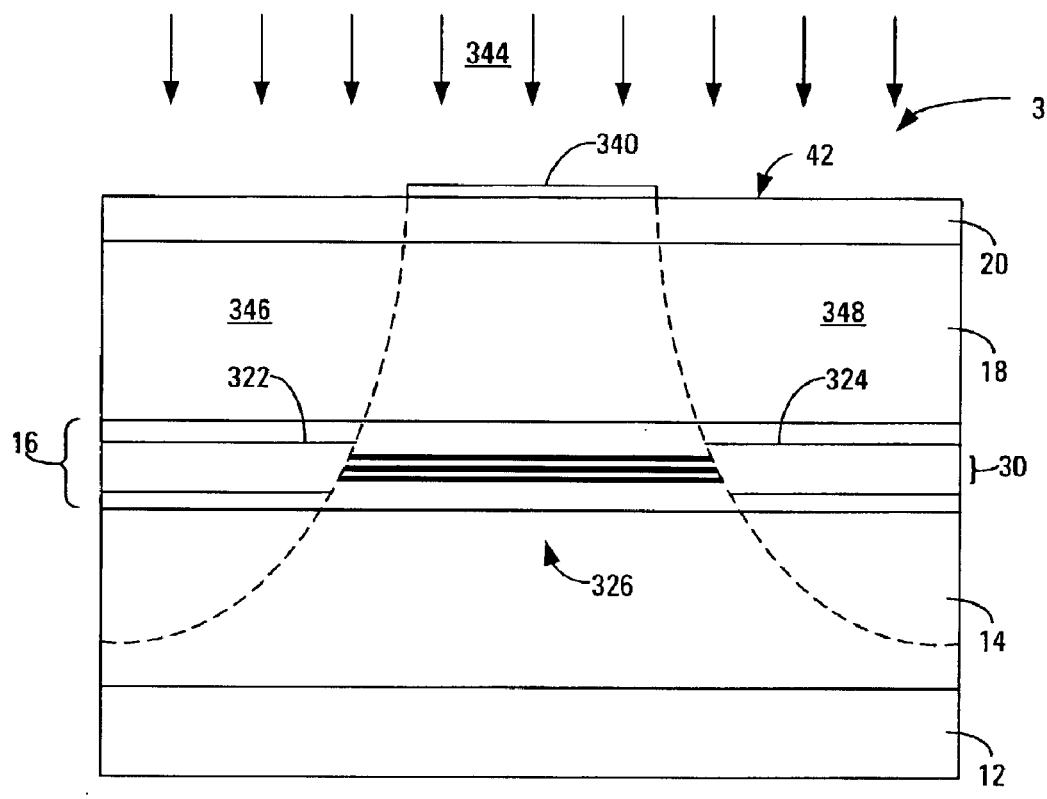
FIG. 5A is an end view of the layer structure shown in FIG. 1 illustrating the spatially-selective promotion of intermixing of atoms on the group V sublattice by introduction of an acceptor impurity.

FIG. 5A shows an example 300 of a buried heterostructure waveguide laser according to the invention in which lateral confinement structures 322 and 324 are fabricated by spatially-selective intermixing of atoms on the group V sublattice promoted by spatially-selectively diffusing an acceptor impurity into parts of layer structure 10 shown in FIG. 1.

A layer of a mask material is deposited on the surface 42 of layer structure 10. Silicon nitride may be used as the mask material. The layer of mask material is patterned to define mask 340 located on a part of surface 42 over the intended location of waveguide 326 in each laser fabricated in the layer structure. Mask deposition and patterning processes suitable for use with group III–V semiconductor materials are known in the art.

Layer structure 10 is placed in a sealed ampoule (not shown) together with a source of zinc. Suitable sources of zinc include metallic zinc, zinc arsenide, a mixture of metallic zinc and arsenic or a mixture of metallic zinc and indium arsenide. The ampoule is heated. This deposits zinc atoms 344 on regions of surface 42 not protected by mask 340. The zinc atoms diffuse from the surface into the layer structure, doping the materials of the layer structure p-type to form p-type doped regions 346 and 348. Heating is continued until a concentration of acceptor impurities sufficient to promote intermixing has been established in quantum well heterostructure 30. In one embodiment, the ampoule was heated to a temperature in the range from 400° C. to 500° C. for several hours. The process time depends on the thickness of layer structure 10 between surface 42 and active layer 16.

In quantum well heterostructure 30, the acceptor impurities in p-type doped regions 346 and 348 displace some of the group V atoms, i.e., arsenic atoms and nitrogen atoms, from the group V sublattice. This promotes intermixing in the doped regions between the group V atoms of the semiconductor material of quantum well layers 31–33 and the group V atoms of the semiconductor material the barrier layers 34–37 to form lateral confinement structures 322 and 324. Specifically, there is a net diffusion of nitrogen atoms from the quantum well layers into the barrier layers. This homogenizes the nitrogen fraction in the regions of quantum well heterostructure 30 located in the p-type doped regions 344 and 346 to form lateral confinement structures 322 and 324. The lateral confinement structures flanking the waveguide 326 consequently have a higher bandgap energy and lower refractive index than the quantum well layers 31–33 located in the waveguide.

The process illustrated in FIG. 5A for promoting spatially-selective intermixing may also be applied to an embodiment of layer structure 10 in which the material of quantum well layers 31–33 is GaAsSb. Atoms of the acceptor impurity in p-type diffused regions 346 and 348 displace atoms from the group V sublattice and the displaced atoms are then free to intermix. In this case, there is a net diffusion of antimony atoms from the quantum well layers into adjacent ones of barrier layers 34–37. The semiconductor material of the lateral confinement structures formed by the net diffusion of antimony atoms has a higher bandgap energy and lower refractive index than the semiconductor material of quantum well layers 31–33.

Spatially selective intermixing promoted by introducing an acceptor impurity may also be used to fabricate lateral confinement structures in layer structures in which the material of barrier layers 34–37 is (In)GaAs or (In)GaAsN. In embodiments in which (In)GaAsN is the material of both the quantum well layers and the barrier layers, the nitrogen fraction in the (In)GaAsN of the barrier layers should be less than that in the (In)GaAsN of the quantum well layers for the intermixing on the group V sublattice to produce the material of the lateral confinement structures with the characteristics described above.

Acceptor impurities to promote spatially-selective intermixing may alternatively be introduced by implanting the acceptor impurities into layer structure 10 instead of by diffusion as just described. Spatially-selective intermixing may also be promoted by implanting ions of a group V element such as arsenic or phosphorus.

As a further alternative, acceptor impurities or group V atoms may be introduced by a spatially-selective diffusion or implantation into active layer 16 before cladding layer 18 and cap layer 20 are grown over active layer 16. The spatially-selective diffusion or implantation may alternatively be performed after cladding layer 18 is partially grown. In these alternatives, prior to performing the diffusion or implantation, a suitable mask material such as $Si_3N_4$ is deposited on the surface of the partially-finished layer structure and is patterned to define a mask located over the intended location of the waveguide in each laser fabricated in the layer structure.

Use of the spatially-selective intermixing processes described above is evidenced in the finished device by the presence of a higher concentration of acceptor impurities in lateral confinement regions 322 and 324 than in waveguide 326.

As an alternative to introducing acceptor impurities or Group V atoms to promote spatially-selective intermixing, donor impurities may be introduced. Suitable donor impurities include silicon (Si) and group VI elements such as sulphur (S), selenium (Se) and tellurium (Te). The donor impurities are introduced by spatially-selective diffusion or implantation into active layer 16 or into a part-grown active layer 18. Group VI atoms introduced to promote spatially-selective intermixing occupy sites in the group V sublattice. In so doing, the group VI atoms eject group V atoms from the group-V sublattice. The ejected group V atoms are then free to intermix.

Use of the spatially-selective intermixing process just described is evidenced in the finished device by the presence of a higher concentration of donor impurities in lateral confinement regions 322 and 324 than in waveguide 326.

Figure 5B:
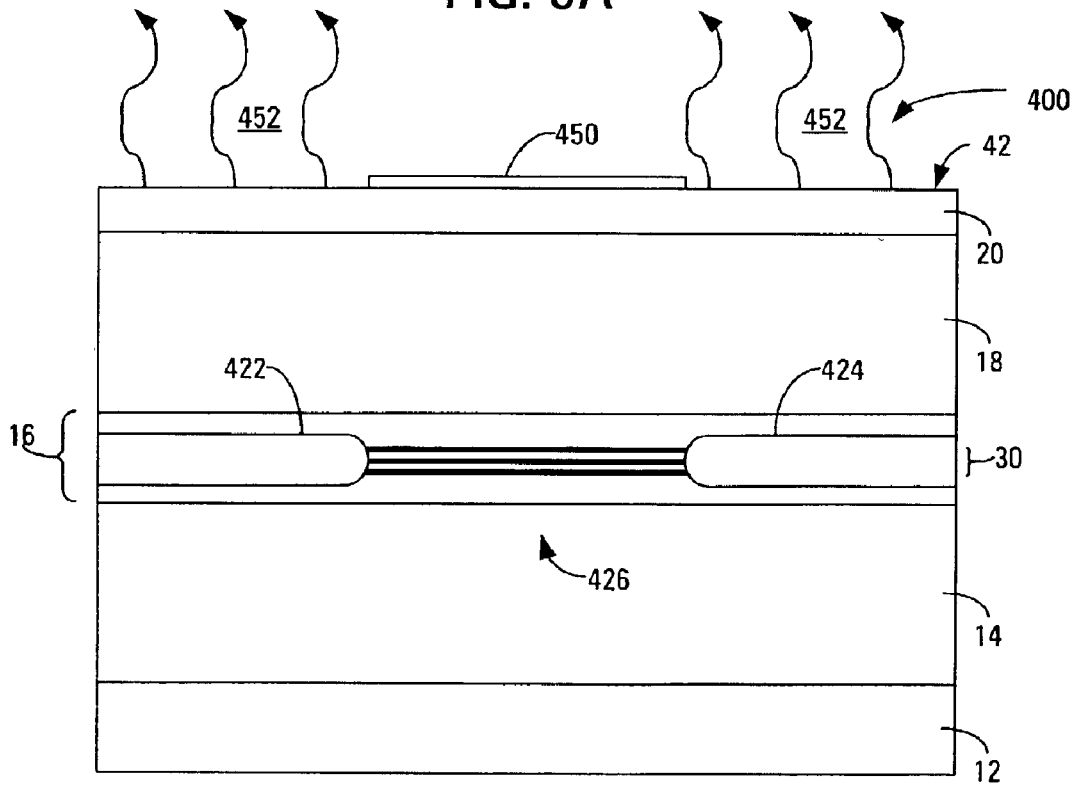
FIG. 5B is an end view of the layer structure shown in FIG. 1 illustrating the spatially-selective promotion of intermixing of atoms on the group V sublattice by a capped anneal.

Another process that may be employed to promote spatially-selective intermixing to form lateral confinement structures in layer structure 10 is capped thermal annealing illustrated in FIG. 5B. The capped annealing process creates vacancies in the group V sublattice that can be occupied by other group V atoms.

FIG. 5B shows an example 400 of a buried heterostructure waveguide laser according to the invention in which lateral confinement structures 422 and 424 are fabricated by spatially-selective intermixing of atoms on the group V sublattice promoted by a capped anneal applied to layer structure 10 shown in FIG. 1. A cap layer (not shown) of a suitable cap layer material such as silicon dioxide or silicon nitride is deposited on the surface 42 of the layer structure. The cap layer is patterned to define cap 450 located on a part of surface 42 over the intended location of waveguide 426 in each laser fabricated in the layer structure. Cap layer deposition and patterning processes suitable for use with group III–V semiconductor materials are known in the art.

Layer structure 10 is placed in a furnace and is annealed for several hours at a temperature of about 600° C. The annealing causes the more volatile group V elements 452 to escape preferentially from the layer structure. The escape of the more-volatile group V elements creates vacancies in the group V sublattice of the semiconductor material of the layer structure adjacent the portions of surface 42 not covered by cap 450. Over time, the vacancies diffuse into the bulk of the layer structure, eventually reaching quantum well heterostructure 30. The vacancies created in the group V sublattice in the quantum well heterostructure enable atoms of nitrogen or antimony to diffuse from quantum well layers 31–33 into adjacent ones of barrier layers 34–37 to homogenize the nitrogen or antimony fraction of the regions of the quantum well heterostructure not protected by cap 450. Semiconductor material in which the nitrogen or antimony fraction is homogenized forms lateral confinement structures 422 and 424.

The capped anneal process just described may initially be performed at a high temperature to create the vacancies in the group V sublattice near the surface 42 of layer structure 10. The temperature may then be reduced to allow the vacancies to diffuse into the bulk of the layer structure without incurring further damage to the crystal structure of the layer structure that would otherwise be caused by maintaining the original high temperature.

In embodiments of quantum well heterostructure 30 in which the materials of quantum well layers 31–33 and barrier layers 34–37 include different group III elements, the material of the lateral confinement structures may be formed by a combination of the above-described spatially-selective intermixing of atoms on the group V sublattice and spatially-selective intermixing of atoms on the group III sublattice. For example, in an embodiment in which the material of the barrier layers is AlGaAs and the material of the quantum well layers is (In)GaAsN or GaAsSb, spatially-selective intermixing of aluminum from the barrier layers into the (In)GaAsN or GaAsSb of the quantum well layers further increases differences in refractive index and bandgap energy between the material of the quantum well layers and the material of the lateral confinement structures resulting from the intermixing. Additionally, diffusion of indium from the quantum well layers into the adjacent ones of the barrier layers increases the bandgap energy and reduces the refractive index of the material of the lateral confinement structures.

Spatially-selective intermixing of atoms on both the group III sublattice and the group V sublattice may be promoted as follows. Growth of layer structure 10 is interrupted after cladding layer 18 reaches a thickness of about 100–200 nm. A layer of diffusion mask material is deposited on the surface of the layer structure and the layer of diffusion mask material is patterned to form a diffusion mask over the intended location of waveguide 126. A layer of silicon is deposited on the exposed surface of the layer structure and the diffusion mask by passing silane ($SH_4$) over the layer structure. The layer structure is heated to a temperature in the range from about 600° C. to about–800° C. for a time in the range from about one hour to about ten hours to cause the silicon to diffuse into regions of quantum well heterostructure 30 in which the lateral confinement structures are to be formed. Diffusion of the silicon into the quantum well heterostructure promotes spatially-selective intermixing of atoms on the group III sublattice between quantum well layers 31–33 and adjacent ones of barrier layers 34–37 in the regions. This homogenizes the group III composition of these regions to form part-finished lateral confinement structures 122 and 124. The intermixing of atoms on the group III sublattice causes the material of part-finished lateral confinement structures 122 and 124 to differ from the material of quantum well layers in both band gap energy and refractive index.

The layer structure 10 is then etched to remove the diffusion mask and any silicon remaining on its surface. Growth of layer structure 10 is then completed, i.e., cladding layer 18 is grown to its full thickness and cap layer 20 is grown. Atoms of an acceptor impurity are then selectively introduced into the layer structure, as described above. Introduction of the acceptor impurity into the regions of quantum well heterostructure 30 in which the part-finished lateral confinement structures are located promotes spatially-selective intermixing of atoms on the group V sublattice between quantum well layers 31–33 and adjacent ones of barrier layers 34–37. This homogenizes the group V composition of these regions to complete the fabrication of lateral confinement structures 122 and 124. The intermixing of atoms on the both the group III sublattice and the group V sublattice causes the semiconductor material of lateral confinement structures 122 and 124 to differ from the semiconductor material of the quantum well layers in both band gap energy and refractive index by more than the semiconductor material of the part-finished lateral confinement structures 122 and 124 just described.

FIGS. 6A–6D show an embodiment of an integrated laser and electro-absorption modulator (EAM) 500 as a second example of a group III–V semiconductor device that includes a region of a semiconductor material made by promoting spatially-selective intermixing of atoms on the group V sublattice. The laser is a distributed feedback laser having an active layer that includes a quantum well heterostructure composed of one or more quantum well layers and a corresponding number of barrier layers. The optical modulator includes a control region of a semiconductor material made by promoting spatially-selective intermixing of atoms on the group V sublattice between the layers that also constitute the quantum well heterostructure of the laser. The refractive index of the semiconductor material of the control region differs from that of the quantum well layers by an amount sufficient to reduce the wavelength corresponding to the band edge by about 50 nm. This makes the control region transparent at the wavelength of the light generated in the quantum well heterostructure. A reverse electric field applied to the control region increases the wavelength corresponding to the band edge to a value greater than the wavelength of the light generated in the quantum well heterostructure and renders the control region opaque. Structures similar to those shown in FIGS. 2A and 6A can also be used to make other optical and electro-optical devices, such as transparent optical waveguides or non-absorbing mirror regions.

Referring now to FIGS. 6A–6D, multiple ones of integrated laser and EAM 500 are fabricated in layer structure 10 described above with reference to FIG. 1. Elements of integrated laser and EAM 500 that constitute parts of the layer structure are indicated using the same reference numerals and will not be described again in detail. The integrated laser and EAM is composed of laser 502 and EAM 504 that share a common waveguide 526. The waveguide is bounded in the z-direction by confinement layers 14 and 18 and in the y-direction by a ridge structure 506.

Waveguide 526 includes active layer 16 sandwiched between cladding layers 14 and 18. Quantum well heterostructure 30 initially exists throughout the active layer. Spatially-selective intermixing of atoms on the group V sublattice is promoted in a region of the quantum well heterostructure to form control region 520 of EAM 504. Once the control region is formed, the quantum well heterostructure exists only in distributed feedback (DFB) laser 502.

DFB laser 502 also includes grating 510 located in cladding layer 18. The grating is separated from barrier layer 37 by about 200 nm. The grating provides the feedback for the DFB laser.

P-electrode 530 of DFB laser 502 is located atop cladding layer 20 over the DFB laser. P-electrode 540 of EAM 504 is located atop cladding layer 20 over control region 520. N-electrode 560 is common to both the DFB laser and the EAM and is supported by substrate 12.

Isolation trench 550 is located between n-electrode 530 and n-electrode 540. The isolation trench divides cap layer 20 into a portion underlying electrode 530 and a portion underlying electrode 540. The isolation trench additionally extends part-way into cladding layer 18. The isolation trench electrically isolates DFB laser 502 from EAM 504.

Integrated laser and EAM 500 is fabricated as follows. A layer structure from which many integrated lasers and EAMs are fabricated is grown on a wafer of n-type GaAs. The layer structure includes layers corresponding to the layer structure 10 described above with reference to FIG. 1.

Cladding layer 14 of n-type AlGaAs is epitaxially grown on wafer 12 of GaAs by a suitable epitaxial growth process such as MOCVD or MBE. Active layer 16 is formed on cladding layer 14 by epitaxially growing the following layers in order: buffer layer 34, quantum well layer 31, buffer layer 35, quantum well layer 32, buffer layer 36, quantum well layer 33 and buffer layer 37. Materials and thicknesses for the layers constituting the active layer are described above.

Cladding layer 18 is epitaxially grown to a thickness ranging from about 100 nm to about 200 nm and grating layer 508 is grown on the surface of the part-grown cladding layer. The grating layer is a thin layer of semiconductor material whose refractive index differs from that of the material of the cladding layer. The thickness of the grating layer is about 40 nm, for example. In an example in which the material of the cladding layer is AlGaAs, the material of the grating layer is GaAs. The part-fabricated layer structure is then removed from the epitaxy reactor.

A mask layer of silicon dioxide, silicon nitride or another suitable material is deposited on the exposed surface of the layer structure, and the mask layer is patterned to expose the surface of the layer structure over the intended location of control region 520 of each EAM 502. Spatially-selective intermixing of atoms on the group V sublattice between the material of the quantum well layers 31–33 and the material of adjacent ones of barrier layers 34–37 is then promoted. The intermixing may be promoted by introducing an acceptor impurity or a group V element into the layer structure or by performing a capped anneal, as described above. The spatially-selective intermixing forms a region of semiconductor material as the control region. The semiconductor material has a band gap energy and refractive index intermediate between the band gap energies and refractive indices, respectively, of the materials of quantum well layers and the barrier layers.

The mask is then removed and a layer of etch mask material is deposited on the surface of the layer structure. For example, a thin layer of photoresist may be deposited as the etch mask layer. The etch mask layer is patterned to form an etch mask that defines grating 510. The layer structure is then etched to form the grating in grating layer 508. The order in which the intermixing is promoted and the grating is formed may be reversed, but the high temperatures involved in promoting the intermixing make it preferable to form the grating after the intermixing.

The part-fabricated layer structure is then returned to the epitaxy reactor and fabrication of the layer structure is completed by growing the remainder of cladding layer 18 and growing cap layer 20.

The completed layer structure is then removed from the epitaxy reactor, a mask layer is deposited on the exposed surface of the layer structure and the mask layer is patterned to form an etch mask that defines isolation trench 550. The part of the layer structure not protected by the etch mask is etched to a depth part-way through cladding layer 18 to form the isolation trench. The etch is performed using a dry etch process or a wet etch process. When a wet etch process is used, it is desirable to grow an etch stop layer in cladding layer 18 to define the depth of the isolation trench.

Figure 6A:
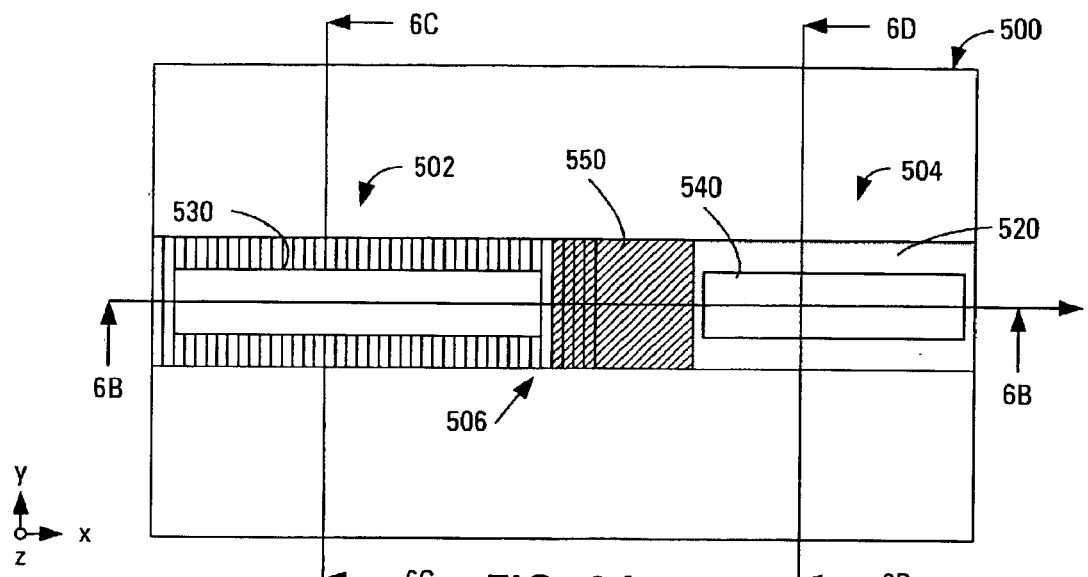
FIG. 6A is a plan view of an embodiment of a distributed feedback laser integrated with an electro-absorption modulator (EAM) as a second example of a semiconductor device according to the invention.
Figure 6B:
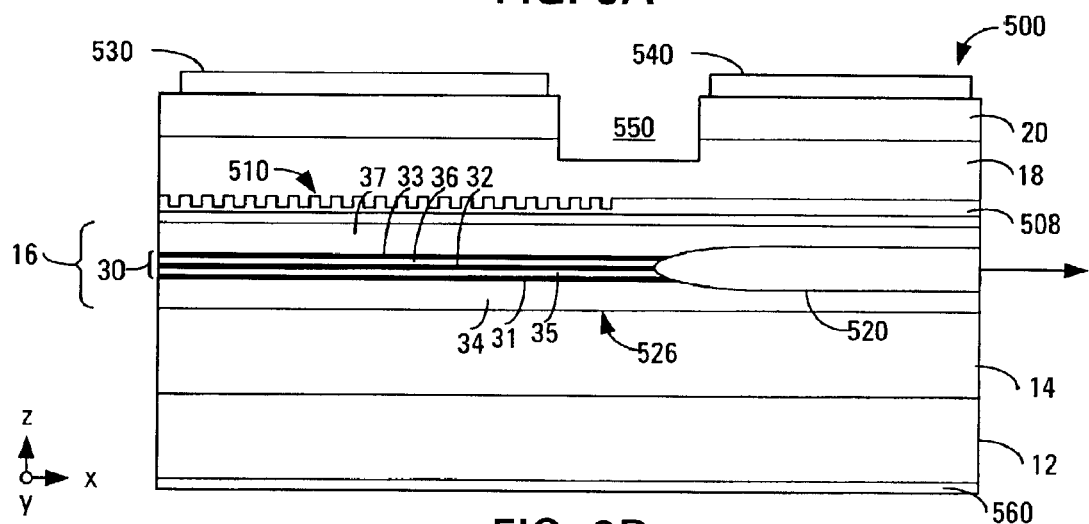
FIGS. 6B–6D are cross-sectional views of the embodiment of the integrated distributed feedback laser and EAM shown in FIG. 6A along the lines 6B—6B, 6C—6C and 6D—6D, respectively.
Figures 6C, 6D:
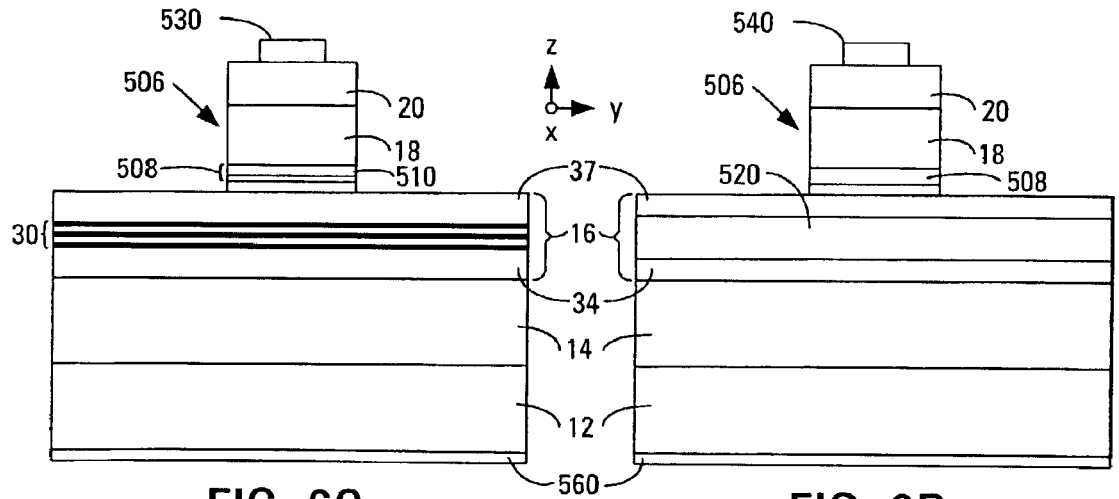

The etch mask is removed and another mask layer is deposited on the exposed surface of the layer structure. The mask layer is patterned to form an etch mask that defines ridge structure 506. The part of the layer structure not protected by the etch mask is etched to a depth part-way through cladding layer 18 or to layer 37 as shown in FIGS. 6C and 6D, to form the ridge structure. Again, the etch may be performed using a dry etch process or a wet etch process. When a wet etch process is used, it is preferable to use an etchant that is selective between the materials of cladding layer 18 and barrier layer 37 to allow barrier layer 37 to serve as an etch stop.

A layer of metal is deposited on both surfaces of the layer structure. The layer of metal deposited on surface 42 of the layer structure is patterned to define p-electrodes 530 and 540. The layer of metal on the other surface of the layer structure provides n-electrode 560.

The layer structure is then divided into individual integrated lasers and EAMs.

When no bias is applied between p-electrode 540 and n-electrode 560, control region 520 of EAM 504 is transparent to the light generated by DFB laser 502. The control region is transparent as a result of its semiconductor material being formed by spatially-selective intermixing of atoms on the group V sublattice and consequently having a band gap energy higher than that of the material of the quantum well layers of the quantum well heterostructure. A reverse bias applied across the control region by electrodes 540 and 560 causes the quantum-confined Stark effect to shift the absorption edge of the semiconductor material of the control region in the long-wavelength direction. This renders the control region absorbent of the light generated by the DFB. Electrical modulation signals having frequencies as high as tens of GHz can be applied between electrodes 540 and 560 to cause the EAM 504 to modulate the light generated by the DFB.

This disclosure describes the invention in detail using illustrative embodiments. However, it is to be understood that the invention defined by the appended claims is not limited to the precise embodiments described.

We claim:

1. A group III–V semiconductor device, comprising:
   a quantum well layer of a first semiconductor material having a band gap energy and a refractive index;
   barrier layers of a second semiconductor material sandwiching the quantum well layer, the second semiconductor material having a higher band gap energy and a lower refractive index than the first semiconductor material; and
   a region of a third semiconductor material formed by spatially-selective intermixing of atoms on the group V sublattice between the first semiconductor material of the quantum well layer and the second semiconductor material of the barrier layer, the third semiconductor material having a band gap energy and a refractive index intermediate between the band gap energy and the refractive index, respectively, of the first semiconductor material and the second semiconductor material.

2. The semiconductor device of claim 1, in which the third semiconductor material is doped with an acceptor impurity, the acceptor impurity promoting the intermixing.

3. The semiconductor device of claim 1, in which the third semiconductor material is doped with a donor impurity, the donor impurity promoting the intermixing.

4. The semiconductor device of claim 1, in which the first semiconductor material comprises $In_xGa_{1-x}AsN$, in which $x \geq 0$.

5. The semiconductor device of claim 1, in which the first semiconductor material comprises GaAsSb.

6. The semiconductor device of claim 1, in which the second semiconductor material comprises $Al_yGa_{1-y}As$, in which $y \geq 0$.

7. The semiconductor device of claim 1, in which the second semiconductor material comprises $In_zGa_{1-z}AsN$, in which $z \geq 0$.

8. The semiconductor device of claim 1, in which:
   the semiconductor device constitutes part of a buried heterostructure waveguide laser;
   the region is a first region; and
   the buried heterostructure waveguide laser additionally comprises:
   a second region of the third semiconductor material formed by spatially-selective intermixing of atoms on the group V sublattice between the first semiconductor material of the quantum well layer and the second semiconductor material of the barrier layers, the first region and the second region constituting lateral confinement structures defining a waveguide therebetween, and
   cladding layers comprising AlGaAs between which the waveguide is located.

9. The semiconductor device of claim 8, additionally comprising a cap layer located adjacent one of the cladding layers.

10. The semiconductor device of claim 9, in which the cap layer comprises GaAs.

11. The semiconductor device of claim 1, in which the third semiconductor material is additionally formed by spatially-selective intermixing of atoms on the group III sublattice between the first semiconductor material of the quantum well layer and the second semiconductor material of the barrier layers.

12. The semiconductor device of claim 1, in which:

the semiconductor device additionally includes additional quantum well layers of the first semiconductor material and respective additional barrier layers of the second semiconductor material; and the third semiconductor material is formed by spatially-selective intermixing of atoms on the group V sublattice between the first semiconductor material of the quantum well layers and the second semiconductor material of adjacent ones of the barrier layers.

13. The semiconductor device of claim 1, in which:

the semiconductor device constitutes part of a distributed feedback laser and an electroabsorption modulator sharing a common waveguide;

the quantum well layer and the barrier layers constitute at least part of an active layer of the distributed feedback laser; and the region of the third semiconductor material constitutes a control region of the electroabsorption modulator.

14. A method of making a semiconductor device, the method comprising:

forming a first layer of a first semiconductor material having a band gap energy and a refractive index between adjacent second layers of a second semiconductor material having a higher band gap energy and a lower refractive index than the first semiconductor material; and promoting spatially-selective intermixing of atoms on the group V sublattice between the first semiconductor material of the first layer and the second semiconductor material of the second layers to form a region of a third semiconductor material, the third semiconductor material having a band gap energy and a refractive index intermediate between the band gap energy and the refractive index, respectively, of the first semiconductor material and the second semiconductor material.

15. The method of claim 14, in which the promoting includes selectively introducing an acceptor impurity into a region of the first and second layers in which the region of the third semiconductor material is to be formed.

16. The method of claim 14, in which introducing the acceptor impurity includes diffusing the acceptor impurity.

17. The method of claim 14, in which the acceptor impurity comprises at least one of zinc and magnesium.

18. The method of claim 14, in which the promoting includes selectively introducing a donor impurity into a region of the first and second layers in which the region of the third semiconductor material is to be formed.

19. The method of claim 18, in which introducing the donor impurity includes implanting the donor impurity.

20. The method of claim 18, in which the donor impurity comprises at least one of silicon, sulphur, selenium and tellurium.

21. The method of claim 14, in which the promoting includes performing a capped anneal.

22. The method of claim 14, in which the first semiconductor material comprises $In_xGa_{1-x}AsN$, in which $x \geq 0$.

23. The method of claim 14, in which the first semiconductor material comprises GaAsSb.

24. The method of claim 14, in which the second semiconductor material comprises $Al_yGa_{1-y}As$, in which $y \geq 0$.

25. The method of claim 14, in which the second semiconductor material comprises $In_zGa_{1-z}AsN$, in which $z \geq 0$.

26. The method of claim 14, additionally comprising promoting spatially-selective intermixing in the region between atoms on the group III sublattice between the first semiconductor material of the quantum well layer and the second semiconductor material of the barrier layers.

* * * * *